(12) United States Patent
Mun

(10) Patent No.: US 8,255,643 B2
(45) Date of Patent: Aug. 28, 2012

(54) MEMORY SYSTEM AND DATA PROCESSING METHOD THEREOF

(75) Inventor: Kui-Yon Mun, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 401 days.

(21) Appl. No.: 12/656,131

(22) Filed: Jan. 19, 2010

(65) Prior Publication Data

US 2010/0217921 A1 Aug. 26, 2010

(30) Foreign Application Priority Data

Feb. 24, 2009 (KR) .................. 10-2009-0015346

(51) Int. Cl.
*G06F 13/00* (2006.01)

(52) U.S. Cl. ......... 711/154; 711/103; 711/156; 711/170

(58) Field of Classification Search .................. 711/103, 711/154, 156, 170
See application file for complete search history.

(56) References Cited

U.S. PATENT DOCUMENTS

| 2008/0201538 A1 | 8/2008 | Furuichi | |
|---|---|---|---|
| 2011/0157992 A1* | 6/2011 | Strasser et al. | ........... 365/185.18 |

FOREIGN PATENT DOCUMENTS

| JP | 2004-005179 | 1/2004 |
|---|---|---|
| JP | 2008-117003 | 5/2008 |
| JP | 2008-158908 | 7/2008 |
| JP | 2008-198299 | 8/2008 |
| JP | 2008-204528 | 9/2008 |
| JP | 2008-287803 | 11/2008 |

* cited by examiner

*Primary Examiner* — Reba I Elmore
(74) *Attorney, Agent, or Firm* — Harness, Dickey & Pierce, P.L.C.

(57) ABSTRACT

A method of processing data of a nonvolatile memory includes performing a randomization operation on a data unit including page data to be programmed into the nonvolatile memory and page metadata corresponding to the page data and generating a random seed; and programming the randomized data unit, and the random seed into the nonvolatile memory, the randomized data unit including the randomized page data and the randomized page metadata. The random seed is programmed within the page metadata and a position at which the random seed is programmed is based on a characteristic of the page data.

10 Claims, 11 Drawing Sheets

Fig. 8

| Page group<br>Word line | A | B | C | A | B | C |
|---|---|---|---|---|---|---|
| WL0 | 0 | | | 1 | | |
| WL1 | 2 | 6 | 12 | 3 | 7 | 13 |
| WL2 | 4 | 10 | 18 | 5 | 11 | 19 |
| WL3 | 8 | 16 | 24 | 9 | 17 | 25 |
| WL4 | 14 | 22 | 30 | 15 | 23 | 31 |
| WL5 | 20 | 28 | 36 | 21 | 29 | 37 |
| WL6 | 26 | 34 | 42 | 27 | 35 | 43 |
| WL7 | 32 | 40 | 48 | 33 | 41 | 49 |
| WL8 | 38 | 46 | 54 | 39 | 47 | 55 |
| WL9 | 44 | 52 | 60 | 45 | 53 | 61 |
| WL10 | 50 | 58 | 66 | 51 | 59 | 67 |
| WL11 | 56 | 64 | 72 | 57 | 65 | 73 |
| WL12 | 62 | 70 | 78 | 63 | 71 | 79 |
| WL13 | 68 | 76 | 84 | 69 | 77 | 85 |
| WL14 | 74 | 82 | 90 | 75 | 83 | 91 |
| WL15 | 80 | 88 | 96 | 81 | 89 | 97 |
| WL16 | 86 | 94 | 102 | 87 | 95 | 103 |
| WL17 | 92 | 100 | 108 | 93 | 101 | 109 |
| WL18 | 98 | 106 | 114 | 99 | 107 | 115 |
| WL19 | 104 | 112 | 120 | 105 | 113 | 121 |
| WL20 | 110 | 118 | 126 | 111 | 119 | 127 |
| WL21 | 116 | 124 | 132 | 117 | 125 | 133 |
| WL22 | 122 | 130 | 138 | 123 | 131 | 139 |
| WL23 | 128 | 136 | 144 | 129 | 137 | 145 |
| WL24 | 134 | 142 | 150 | 135 | 143 | 151 |
| WL25 | 140 | 148 | 156 | 141 | 149 | 157 |
| WL26 | 146 | 154 | 162 | 147 | 155 | 163 |
| WL27 | 152 | 160 | 168 | 153 | 161 | 169 |
| WL28 | 158 | 166 | 174 | 159 | 167 | 175 |
| WL29 | 164 | 172 | 180 | 165 | 173 | 181 |
| WL30 | 170 | 178 | 186 | 171 | 179 | 187 |
| WL31 | 176 | 184 | 192 | 177 | 185 | 193 |
| WL32 | 182 | 190 | 198 | 183 | 191 | 199 |
| WL33 | 188 | 196 | 204 | 189 | 197 | 205 |
| WL34 | 194 | 202 | 210 | 195 | 203 | 211 |
| WL35 | 200 | 208 | 216 | 201 | 209 | 217 |
| WL36 | 206 | 214 | 222 | 207 | 215 | 223 |
| WL37 | 212 | 220 | 228 | 213 | 221 | 229 |
| WL38 | 218 | 226 | 234 | 219 | 227 | 235 |
| WL39 | 224 | 232 | 240 | 225 | 233 | 241 |
| WL40 | 230 | 238 | 246 | 231 | 239 | 247 |
| WL41 | 236 | 244 | 252 | 237 | 245 | 253 |
| WL42 | 242 | 250 | 254 | 243 | 251 | 255 |
| WL43 | 248 | | | 249 | | |

MEMORY SYSTEM AND DATA PROCESSING METHOD THEREOF

CROSS-REFERENCE TO RELATED APPLICATIONS

This U.S. non-provisional patent application claims priority under 35 U.S.C. §119 to Korean Patent Application No. 10-2009-0015346, filed on Feb. 24, 2009, the entire contents of which are incorporated herein by reference.

BACKGROUND

1. Field

The present disclosure herein relates to an electronic device, and more particularly, to a memory system and a data processing method thereof.

2. Related Art

Generally, a semiconductor memory is the most necessary micro electronic device in a digital logic design such as a computer and in application based on a microprocessor belonging to a range from a satellite to a consumer electronic technique. Thus, a progress of a technique of manufacturing a semiconductor memory including a process improvement and a technical development obtained through scaling for a high integration and a high speed is helpful in establishing a performance standard of other digital logic system.

Semiconductor memory devices are classified into volatile semiconductor memory devices and nonvolatile semiconductor memory devices. Nonvolatile semiconductor memory devices can store data even when their power supplies are interrupted. Data stored in nonvolatile semiconductor memory devices may be permanent or reprogrammable according to a memory manufacturing technique. Nonvolatile semiconductor memory devices are used to store a program and a micro code in a wide range of an application such as a computer, an avionics, a communication and a consumer electronics industry.

A typical nonvolatile memory device may be a flash memory device. Recently, as mobile devices are widely used, a requirement for high integration of a flash memory increases. Also, as the importance of data stored in mobile devices and memory cards increases, reliability and security for data stored in a flash memory are required.

SUMMARY

Example embodiments provide a method of processing data of a semiconductor memory device. The method includes performing a randomization operation a data unit including page data to be programmed into the nonvolatile memory and page metadata corresponding to the page data; generating a random seed; and programming the randomized data unit and the random seed into the nonvolatile memory. The randomized data unit includes the randomized page data and the randomized page metadata. The randomized seed is programmed within the randomized page metadata, and a position at which the random seed is programmed is changed according to a characteristic of the page data.

Example embodiments also provide a memory system. The memory system includes a nonvolatile memory device; and a memory controller, the memory controller being configured to generate a random seed by performing a randomization operation on a data unit including page data to be programmed on the nonvolatile memory device and page metadata corresponding to the page data, the memory controller being configured to control the nonvolatile memory device to program the randomized data unit and the random seed into the nonvolatile memory device. The randomized data unit includes the randomized page data and the randomized page metadata. The memory controller is further configured to program the random seed within the page metadata, and to vary a position at which the random seed is programmed within the page metadata based on an address of the page data.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 8 is a table illustrating an example of a page classification according to example embodiments.

DETAILED DESCRIPTION OF THE EMBODIMENTS

Figure 1:
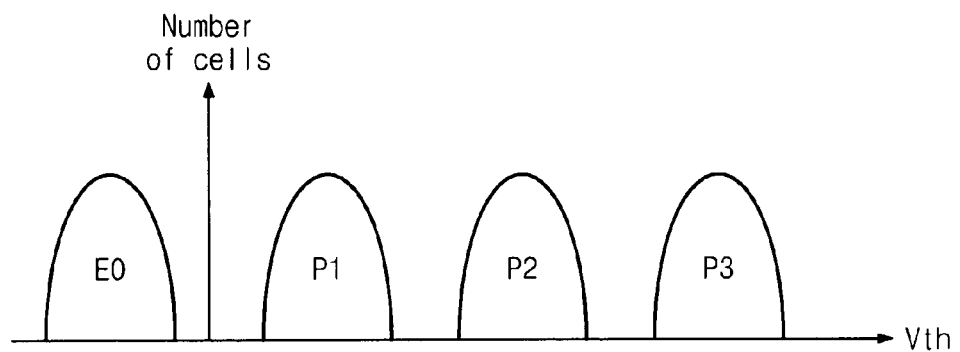
FIG. 1 is a drawing illustrating a distribution of a threshold voltage of a multi-bit flash memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A flash memory is used as an example of a nonvolatile memory to describe features and a functions of example embodiments. However, those skilled in the art will readily appreciate other advantages and performances according to example embodiments based on contents described here. For example, PRMA, MRAM, ReRAM, NOR flash memory may be used as a storage medium and the flash memory may be applied to a memory system in which different kinds of memory devices are mixed. A two bit multi-level cell (MLC) is used as an example to describe features of example embodiments. However, techniques relating to example embodiments may be easily applied to a multi-bit memory device inputting three bits or more in one memory cell.

In a detailed description of example embodiments, technical characteristics of example embodiments are described by using examples of page data and page metadata corresponding to a control information of the page data. However, a size and a kind of data are not limited to the page data and the page metadata. Further, for convenience of description, a random seed generated from a result of a randomization operation will be described as being separate from the page metadata for. However, it is understood that the random seed is included in a category of the page metadata.

FIG. 1 is a drawing illustrating a distribution of a threshold voltage of a multi-bit flash memory device. Referring to FIG. 1, a threshold voltage of a memory cell that stores two bits is illustrated.

An erase state (E0) corresponding to data '11' has a threshold voltage of the lowest level. The program states may correspond to the two bit data as follows a program state (P1) corresponding to data '10', a program state (P2) corresponding to data '00' and a program state (P3) corresponding to data '01'. Here, the corresponding relation between the program states (E0, P1, P2, P3) and the two-bit data is illustrative, and not restrictive. The program states (E0, P1, P2, P3) and the two-bit data corresponding to the program states (E0, P1, P2, P3) may be variously changed according to a design method of a memory device.

In a flash memory device, a threshold voltage of a memory cell has one of the program states (E0, P1, P2, P3) described above. However, a flash memory device has a limit in the number of program and erasure operations that can be performed because data retention characteristic of a memory cell becomes degraded by a leakage of a charge or deterioration of an insulating layer when the program/erasure cycle is performed beyond a specific number of times. Thus, a lot of techniques to avoid a life reduction of memory cell by controlling program/erasure cycles of memory cells are being developed.

Further, when a memory cell is repeatedly programmed in a specific program state, deterioration of distribution may occur. That is, if any one memory cell is repeatedly programmed in a specific program state, the memory cell may have a bad distribution characteristic compared with a memory cell programmed on various program states. Thus, the whole life of a memory device may be reduced by deterioration of the memory cells.

Figure 2:
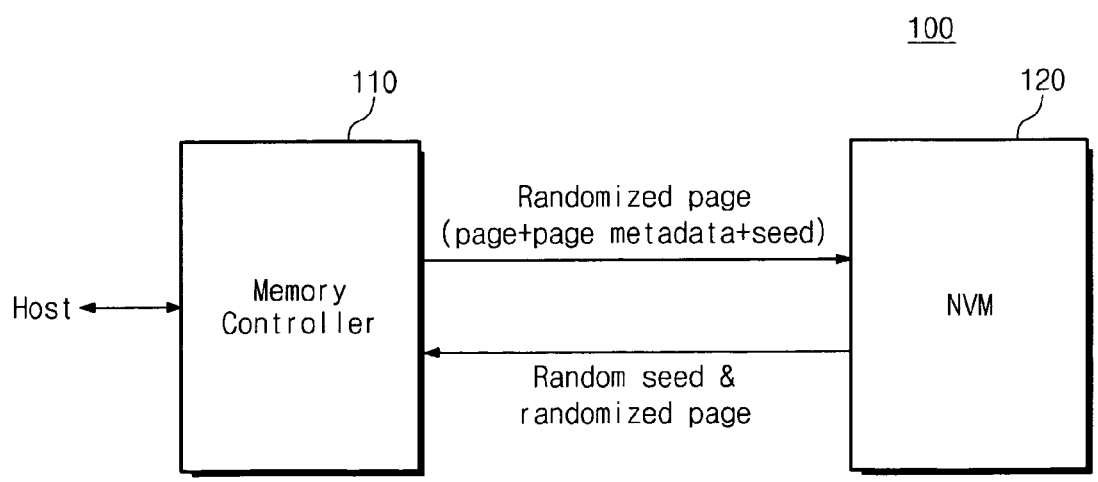
FIG. 2 is a block diagram illustrating a memory system according to example embodiments.

FIG. 2 is a block diagram illustrating a memory system 100 according to example embodiments. Referring to FIG. 2, the memory system 100 includes a nonvolatile memory device 120 and a memory controller 110 for randomizing data to be stored in the nonvolatile memory device 120.

When a program operation is performed, the memory controller 110 classifies program data provided from a host into a predetermined data unit and a randomization operation is performed on the classified data. The randomized data is transferred to the nonvolatile memory device 120 together with a random seed including the randomization data. The randomized data and the random seed are programmed in a predetermined area of the nonvolatile memory device 120.

When a read operation is performed, the memory controller 110 recovers an original arrangement of data with reference to a random seed provided by the nonvolatile memory device 120. The recovered data is transferred to the host.

The memory controller 110 performs a randomization operation on one page data. The memory controller 110 also performs a randomization operation on page metadata being generated from a page data. Generally, in a case of a page data being rearranged through a randomization operation, a random seed for an inverse operation of a randomization operation must be generated. A random seed is data corresponding to a key value to recover an arrangement of randomized data when a read operation is performed. The memory controller 110 performs a randomization operation on a page data and page metadata corresponding to the page data. For example, the memory controller 110 performs a randomization operation on page metadata such as an error correction code (ECC). As a result of the randomization operation, the memory controller 110 outputs a random seed. A random seed may be stored in various positions of a spare area in which page metadata is stored. That is, a random seed is stored in a variable position of a spare area in which spare page metadata is stored according to an address of page data or a characteristic of page data.

Thus, as a randomization operation is performed on one page data being programmed and page metadata corresponding to the page data, a state of a threshold voltage to which memory cells are programmed can be randomized. A position in which a random seed corresponding to a key value of a randomization operation is written may vary in an area in which page metadata is stored. That is, page data, page metadata and a random seed may be randomized in an operation of programming one page. When a read operation is performed, first, a random seed is provided from the nonvolatile memory device 120 to the memory controller 110. The memory controller 110 decodes page data and page metadata continually transferred to the memory controller 110 with reference to the random seed.

Figure 3:
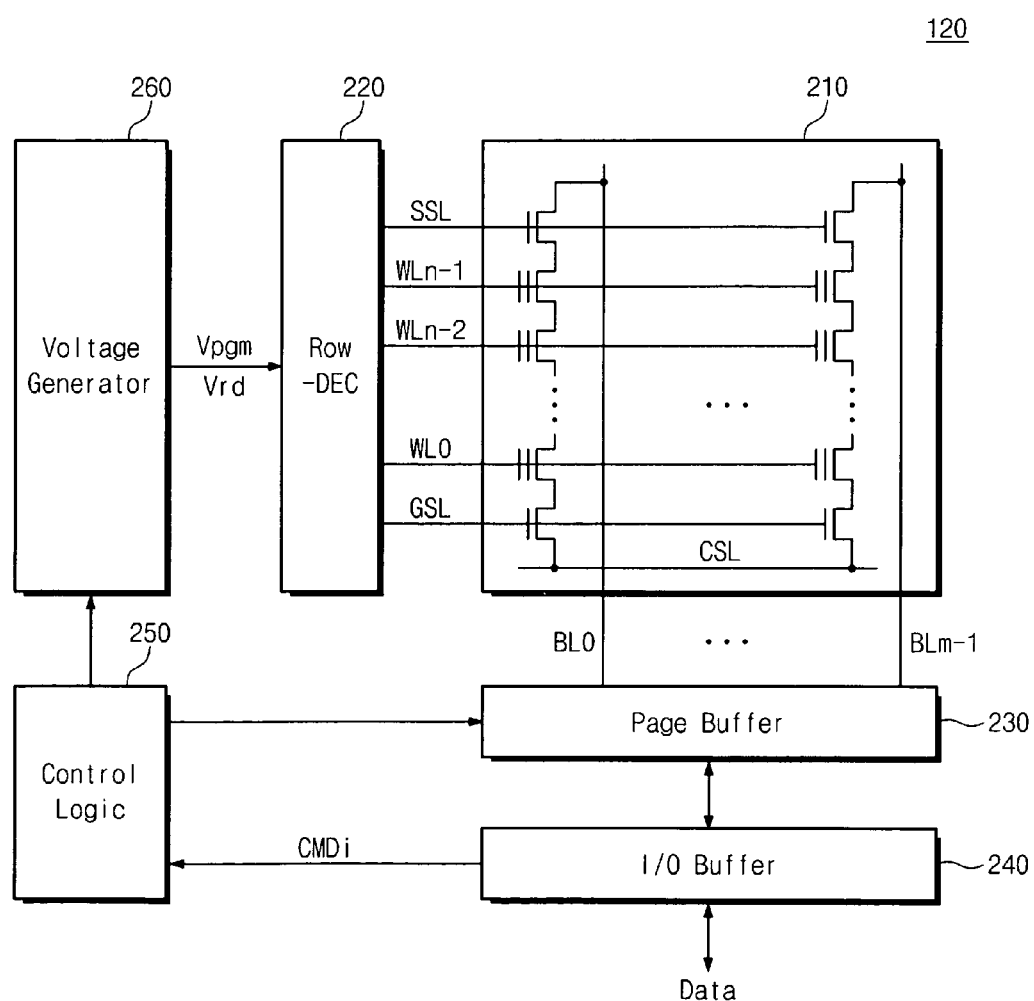
FIG. 3 is a block diagram illustrating a nonvolatile memory device according to example embodiments.

FIG. 3 is a block diagram illustrating a structure of the nonvolatile memory device 120 illustrated in FIG. 2. Referring to FIG. 3, the nonvolatile memory device 120 gives a random characteristic to not only page data but also a page metadata and a random seed value when programming one page data. A detailed description is as follows.

A cell array 210 includes memory cells connected to bit lines and word lines. The cell array 210 includes a main area in which user data of program data is stored and a meta area or a spare area in which a control information of the message field is stored. A plurality of pages is stored in one word line. In a memory device including multi-level cells, a plurality of pages is stored in memory cells connected to one word line. Each page data is randomized to be stored in the main area. Page metadata corresponding to each page data is also randomized to be stored in the spare area.

A random seed generated by a randomization operation of page data and page metadata may be variably stored in any position of the spare area. Thus, deterioration of memory cells of the main area and the spare area may be prevented by a randomization of page data and page metadata. A random characteristic may be provided to a random seed by variously changing a position of a random seed in the spare area according to a page address and a data characteristic.

A row decoder 220 selects a word line in response to a row address. The row decoder 220 transfers various word line voltages (Vpgm, Vrd) provided by a voltage generator 260 to the selected word lines. When a program operation is performed, a program voltage (Vpgm) of, for example 15-20V and a verify voltage (Vfy) are provided to a selected word line and a pass voltage (Vpass) is provided to an unselected word line. When a read operation is performed, the row decoder 220 provides a read voltage (Vrd) provided from the voltage generator 260 to a selected word line and provides a read voltage (Vread) of, for example 5V to an unselected word line.

A page buffer 230 functions as a writer driver or a sense amplifier depending on an operation mode. For example, the page buffer 230 functions as a sense amplifier in a read operation mode and functions as a writer driver in a program operation mode. The page buffer 230 loads data in a unit of a page when a program operation is performed. That is, the page buffer 230 receives data to be programmed from an input/output buffer 240 to store the data in a latch. When the page buffer 230 programs loaded data, the page buffer 230 provides a ground voltage (0V) to memory cells being programmed. The page buffer 230 provides a precharge voltage (e.g., Vcc) to memory cells being program inhibited.

The input/output buffer 240 temporarily stores an address or program data receiving through an input/output pin (I/O pin). The input/output buffer 240 transfers the stored address to an address buffer (not illustrated), the programmed data to the page buffer 230 and a command to a command register (not illustrated). When a read operation is performed, read data provided by the page buffer 230 is transferred to an external device through the input/output buffer 240

When a program operation is performed, a control logic 250 controls the page buffer 230 and the voltage generator 260 so as to write program data provided according to a command (CMDi) provided from the memory controller (110 of FIG. 2) to a selected cell area. The control logic 250 also controls the page buffer 230 and the voltage generator 260 so as to sense and latch data of a cell area selected in response to a command provided from the memory controller (110 of FIG. 2) and output the data.

Figure 4:
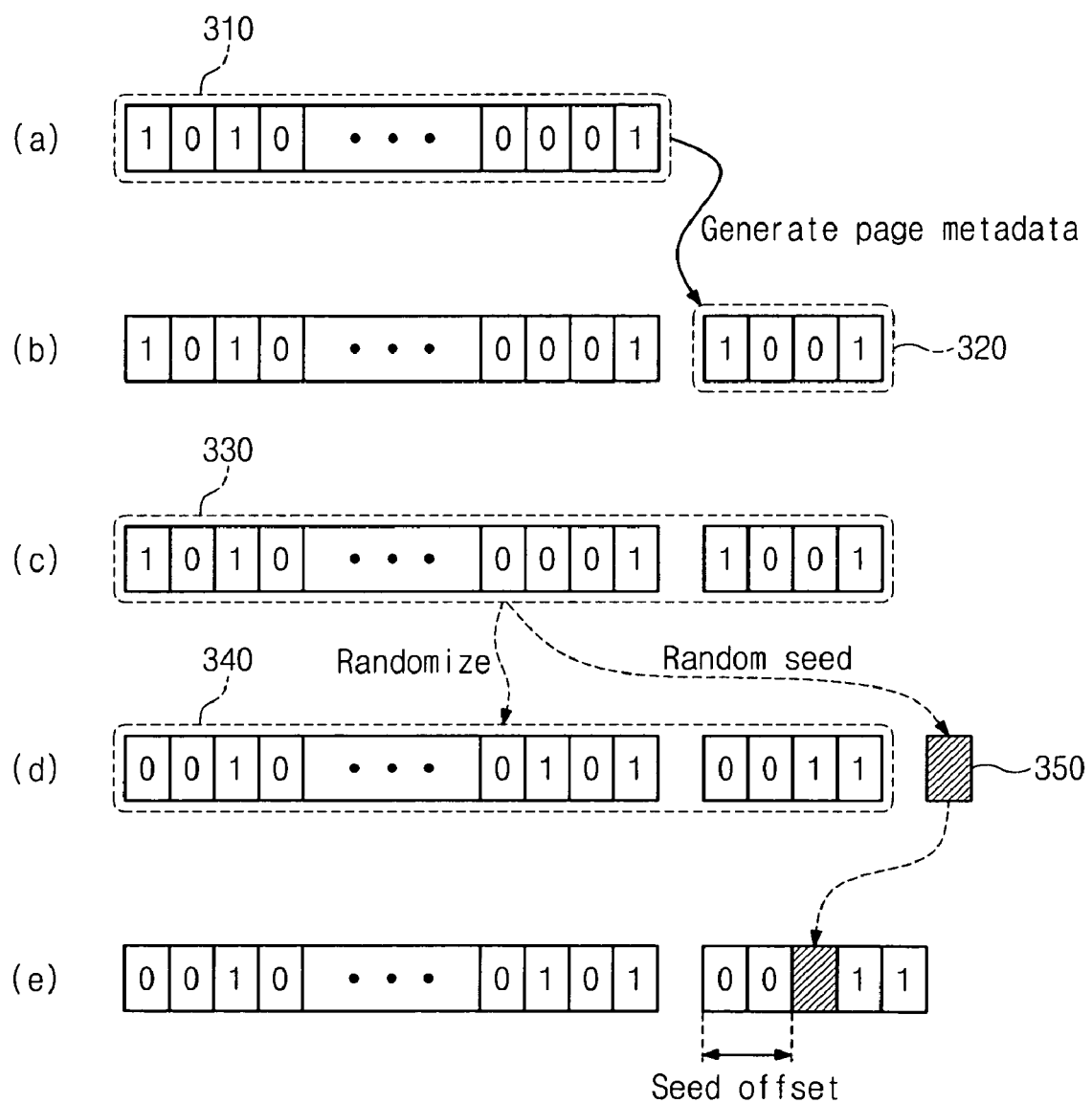
FIG. 4 is a drawing illustrating a first embodiment of a randomization operation method according to example embodiments.

FIG. 4 is a drawing illustrating a process of program data performed in the memory controller 110 of FIG. 2. Referring to FIG. 4, page metadata is generated from program data to be programmed and a randomizing operation is performed on page data and page metadata. A random seed generated by a randomization operation is stored in a spare area in which page metadata is stored on the cell array 210. The random seed may also be stored in a fixed position and a variable position. A detailed description is as follows.

Page data 310 to be programmed is illustrated in (a). When page data 310 to be programmed is inputted in the memory controller 110, the memory controller 110 changes a data arrangement of the page data 310 to a random arrangement before the page data 310 is written to the nonvolatile memory device 120. Before a randomization operation, page metadata including an error correction code, a flag cell and control data is generated.

The page data 310 and page metadata 320 generated from the page data 310 are illustrated in (b) of FIG. 4. The page data 310 and the page metadata 320 are managed by one program unit. It is illustrated in (c) of FIG. 4 that the page data 310 and the page metadata 320 form one data unit 330 for a randomization operation.

The data unit 330 before a randomization operation is performed is illustrated in (c) of FIG. 4. The memory controller 110 performs a randomization operation on the page data 310 and the page metadata 320. The randomization operation rearranges bits corresponding to the page data 310 and the page metadata 320. Data being written to memory cells through a rearrangement may be managed not to be biased to a specific state.

A process by which the data unit 330 including the page data 310 and the page metadata 320 is rearranged into a randomized data unit 340 through a randomization operation is illustrated in (d) of FIG. 4. A random seed 350 providing a key of the randomization operation is also generated.

A write process to a spare area of the random seed 350 is illustrated in (e) of FIG. 4. The data unit 340 includes data "0011" corresponding to page metadata after a the randomization operation. The data "0011" and the random seed 350 are programmed in the spare area. The page data 310 and the page metadata 320 being programmed are randomized, so a probability that a specific data is biased to a memory cell is lowered. However, a randomization operation is not performed on the random seed 350 itself. According to example embodiments, a position that the random seed 350 is written to within the spare area may be changed with reference to an address of the page data or a characteristic of the page data. Consequently, an effect similar to the randomization operation may be provided through a variation of a program position of the random seed 350. A feature of a write position of the random seed 350 is described in FIG. 5 in detail.

Figure 5:
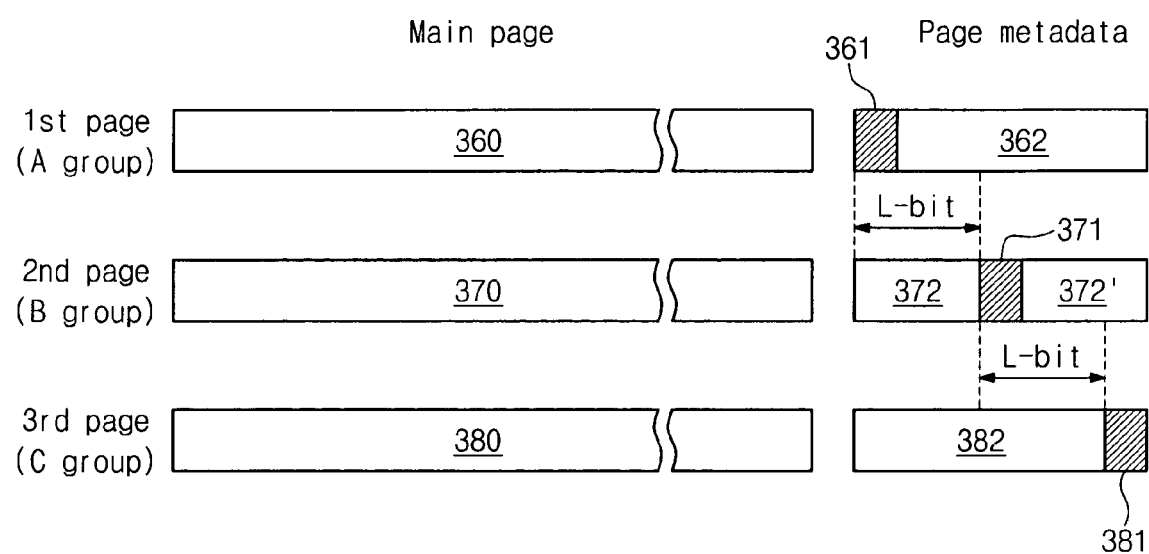
FIG. 5 is a drawing illustrating a position of a random seed set according to a process of FIG. 4.

FIG. 5 is a drawing illustrating a write position of a random seed with respect to the page data and the page metadata. Referring to FIG. 5, a random seed is stored in a different position of the spare area according to a characteristic of page data provided for a program. According to example embodiments, a technical characteristic is described by an embodiment determining a position of a random seed with reference to a page address of page data.

When memory cells sharing the same word line are three-bit MLC, data corresponding to three pages may be stored in the same memory cells. A first page or LSB page is classified into A group. A second page is included in B group. A third page or MSB group may be classified into C group.

When the first page is programmed, the memory controller 110 generates page metadata corresponding to the first page. A randomization operation is performed on the first page and the page metadata corresponding to the first page. A randomized page data 360 and a randomized page metadata 362 are constituted as illustrated in FIG. 5. A random seed 361 being generated through a randomization operation is set to be positioned in a spare area in which the randomized page metadata 362 is programmed as illustrated in FIG. 5. That is, a position of a random seed of the first page is recorded in offset 0 of the spare area.

When the second page is programmed, the memory controller 110 generates page metadata corresponding to the second page. A randomization operation is performed on the second page and the page metadata corresponding to the second page. A randomized page data 370 and a randomized page metadata (372, 372') is constituted as illustrated in FIG. 5. A random seed 371 generated through a randomization operation is set to be positioned in the spare area as illustrated in FIG. 5. That is, the random seed 371 corresponding to the second page is recorded in a position of offset L-bit of the spare area. The random seed 371 is stored in a position shifted by L-bit compared with the random seed 361 in the spare area.

When the third page is programmed, the memory controller 110 generates page metadata corresponding to the third page. A randomization operation is performed on the third page and the page metadata corresponding to the third page. A randomized page data 380 and a randomized page metadata 382' is constituted as illustrated in FIG. 5. A random seed 381 generated through a randomization operation is set to be positioned in the spare area as illustrate in FIG. 5. That is, the random seed 381 corresponding to the third page is recorded in a position of offset 2L-bit of the spare area. The random seed 381 is stored in a position shifted to the right by 2L-bit compared with the random seed 361 in the spare area.

Here, a characteristic of page data is classified with reference to a page address of a three-bit MLC. However, example embodiments are not limited to a page address of a three-bit MLC. The characteristic of page data may be classified into a plurality of groups according to a priority, a security and a kind of page data being programmed. As page data and page metadata are processed by a randomization operation, a probability that a memory cell is biased to a specific data to be programmed in a main area and a spare area may greatly reduced. Also, a random characteristic may be given to the whole data being programmed to memory cells corresponding to the spare area by changing a position of a random seed corresponding to a key value of the randomization operation according to a characteristic of page data.

Figure 6A:
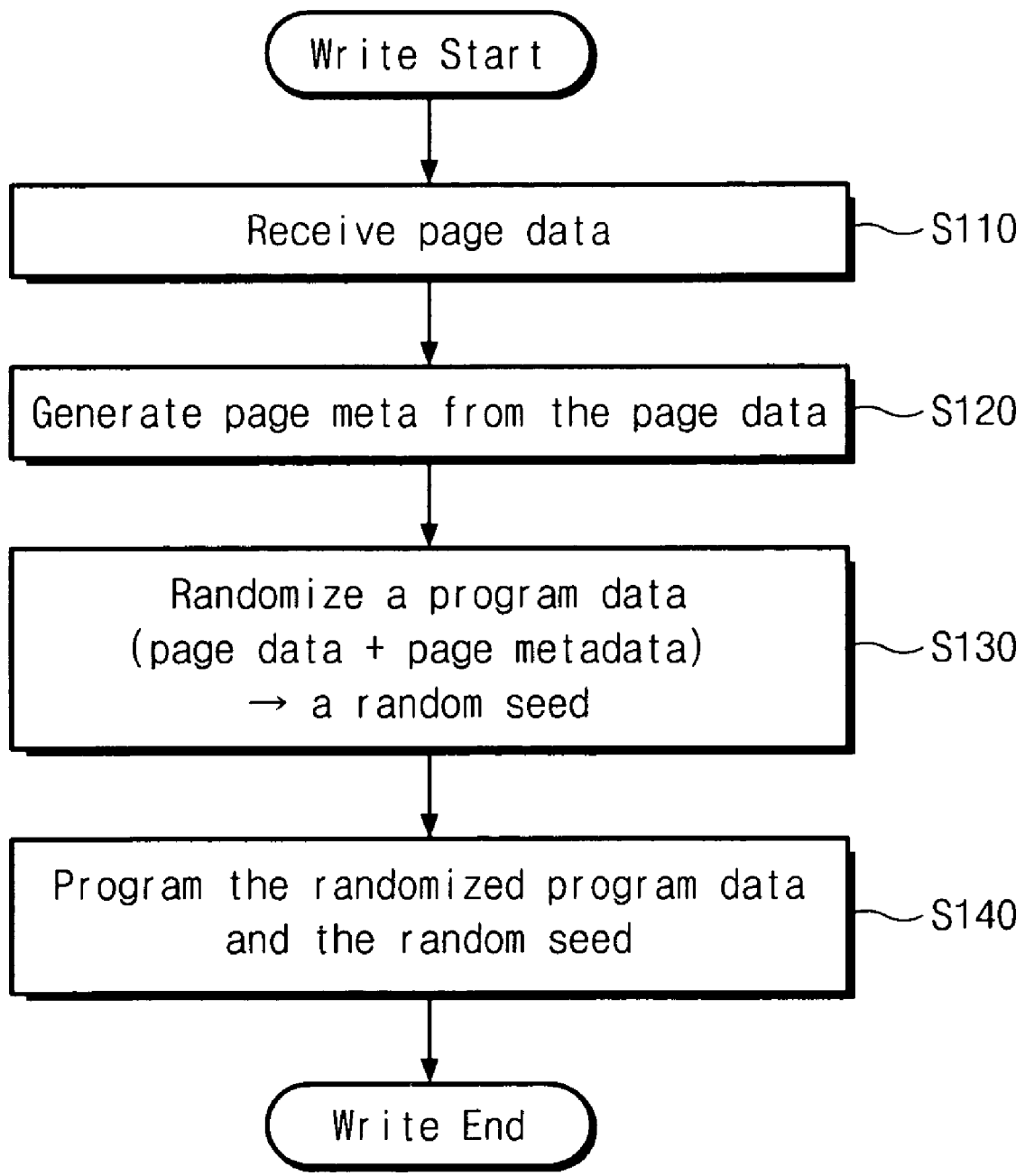
FIG. 6A is a flow chart illustrating a program method according to example embodiments.
Figure 6B:
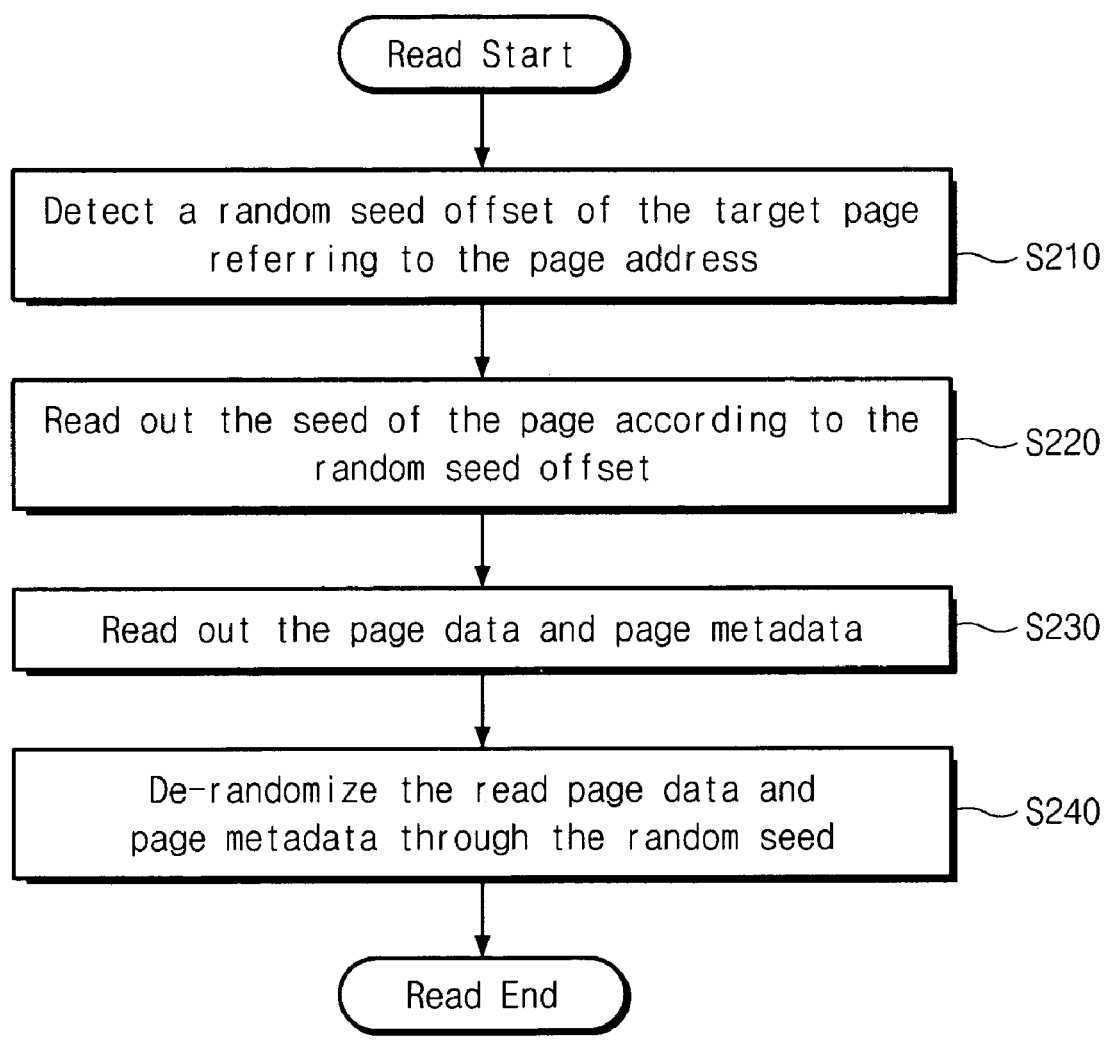
FIG. 6B is a flow chart illustrating a read method according to example embodiments.

FIGS. 6A and 6B are flow charts illustrating a method of managing data by the memory controller 110 of FIG. 2. FIG. 6A illustrates a control process when a write operation is performed and FIG. 6B illustrates a control process when a read operation is performed.

Referring to FIG. 6A, in step S110 the memory controller 110 receives page data being programmed and a page address corresponding to the page data from a host. The memory controller 110 may receive the page data and the page address in response to a command from the host.

In step S120, the memory controller 110 which received the page data performs every data process for generating page metadata from the page data. For example, the memory controller 110 may detect errors from the page data and may generate parity bits for correcting the detected errors. The memory controller 110 may define a characteristic of the page data and may generate control bits which can be used as control data when a read operation is performed. Data generated for an error correction or other controls is called page metadata. The memory controller 110 may perform an address mapping operation converting a logical address provided from the host into a physical address of a nonvolatile memory device.

Subsequently, in step S130, the memory controller 110 performs a randomization operation on page data and page metadata generated from the page data. Arrangements of the page data and the page metadata are randomly changed according to the randomization operation. A random seed corresponding to arrangement information of the page data and the page metadata which are randomized is achieved as a result of the randomization operation.

In step S140, a program operation is performed and the page data, the page metadata and the random seed are programmed. Particularly, a storage position in a spare area of the random seed is determined according to characteristic of the page address or the page data. For example, when program data is included in A group, the random seed is stored in a position that a seed offset is 0. When program data is included in B group, the random seed is stored in a position that a seed offset is L-bit. When program data is included in C group, the random seed is stored in a position that a seed offset is 2L-bit.

According to the program process, one page data, the page metadata corresponding to the page data and the random seed corresponding to the page data may be randomized.

FIG. 6B illustrates a read method of data programmed according to the process illustrated in FIG. 6A. First, in step S210, when a read command is provided from the host, the memory controller 110 detects a position of the random seed with reference to the page address. That is, the memory controller 110 detects an offset of the random seed in response to the read command.

In step S220, the memory controller 110 reads a random seed value from the nonvolatile memory device 120 with reference to the detected offset. In step S230, the memory controller 110 reads the randomized page data and page metadata to be programmed. In step S240, the memory controller 110 performs a de-randomization operation and restores the read page data and the read page metadata to the previous data arrangement of before the randomization operation using the random seed value.

According to the flow charts described above in FIG. 6A, FIG. 6B, multi-bit data programmed on memory cells sharing one word line is randomized and the page data and the random seed corresponding to the multi-bit data are also randomized. Thus, the incidence of a non-uniform program condition where data corresponding to a specific state is repeatedly programmed on a specific memory cell may be reduced.

Figure 7A:
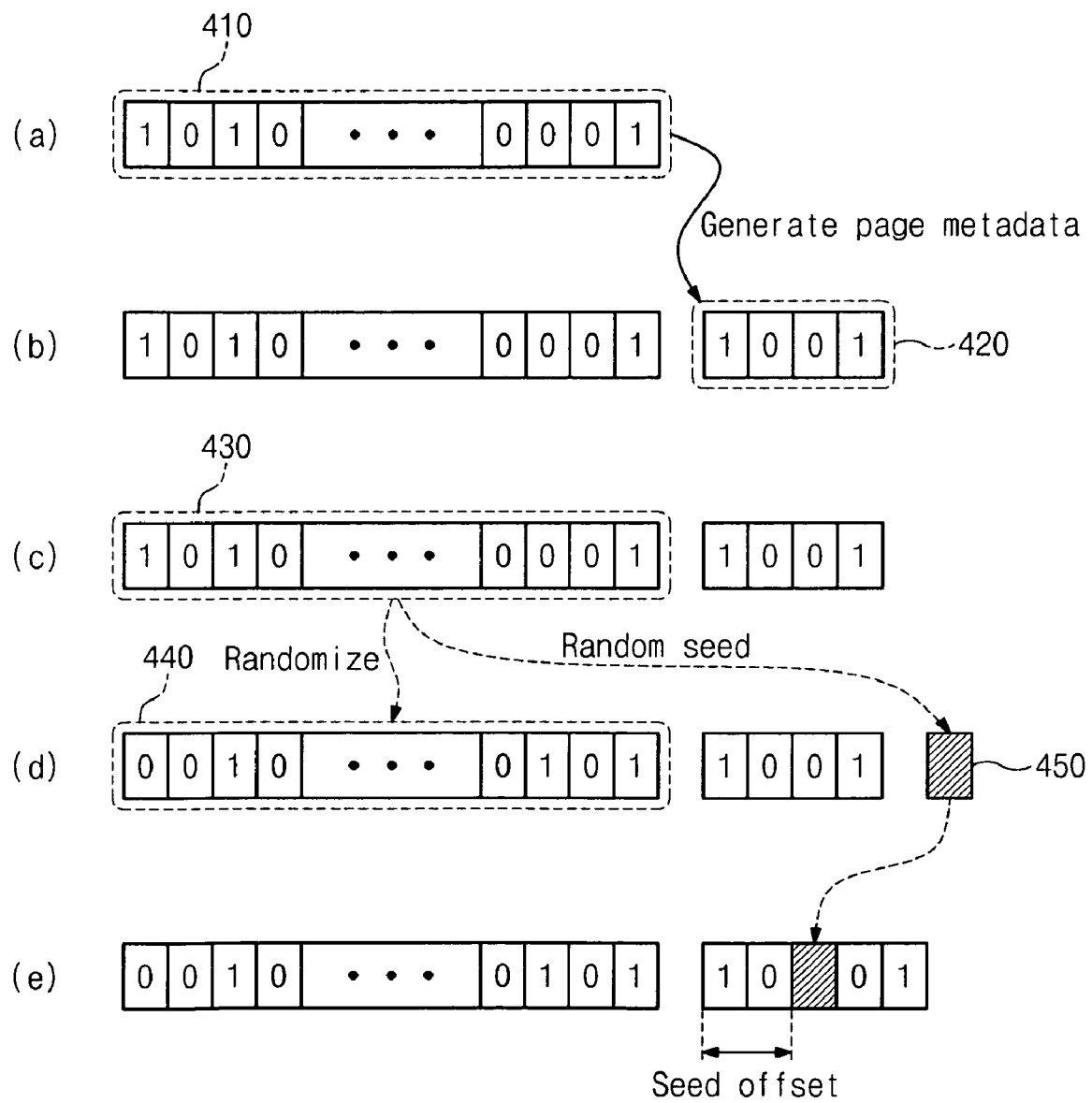
FIG. 7A is a drawing illustrating another embodiment according to example embodiments.
Figure 7B:
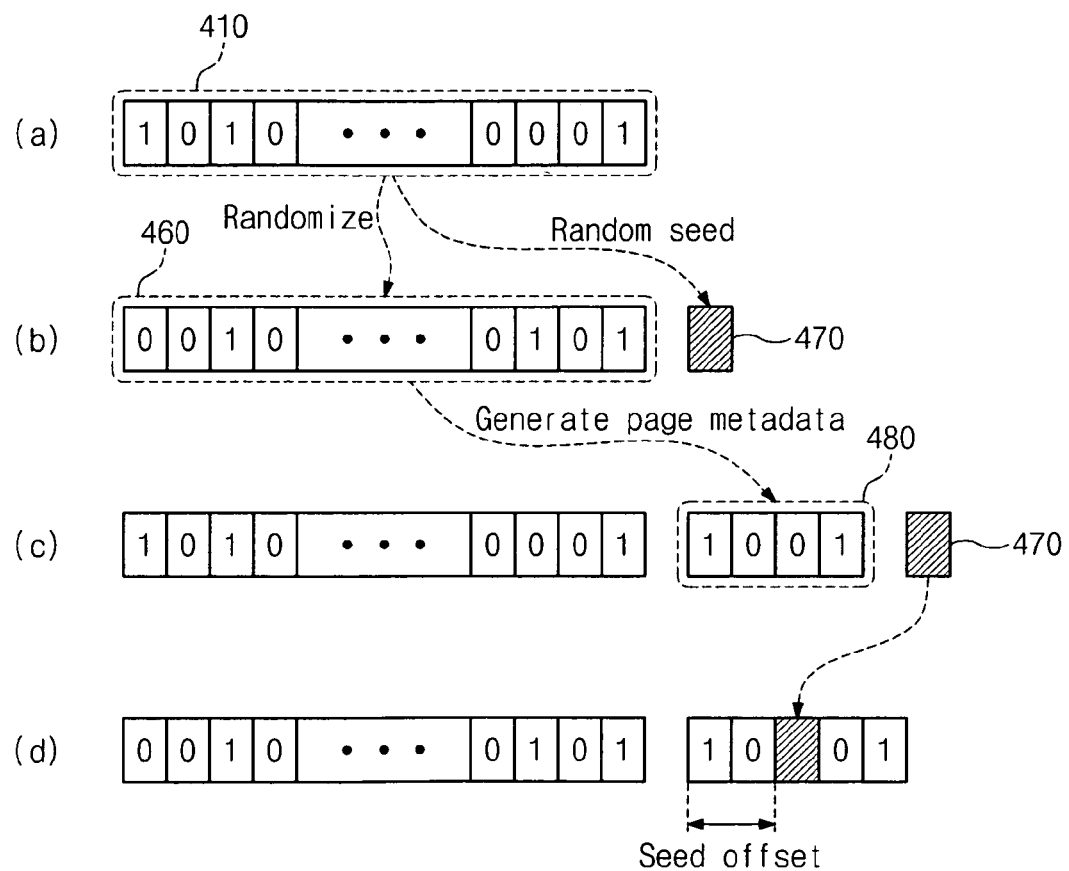
FIG. 7B is a drawing illustrating still another embodiment according to example embodiments.

FIGS. 7A and 7B are drawings illustrating other methods according to example embodiments. FIG. 7A illustrates an example in which a randomization operation is not performed on page metadata and a program position of the random seed is randomized. A process of (a) and (b) illustrated in FIG. 7A where page metadata 420 is generated from page data 410 is identical to the process of (a) and (b) illustrated in FIG. 4 where page metadata 320 is generated from page data 310.

However, in the method illustrated in FIG. 7A, the randomization operation is performed only on the page data, and the randomization operation is not performed on the page metadata. As illustrated in (c) and (d) illustrated in FIG. 7A, the randomization operation is performed only on page data 430 and random seed 450, and not page metadata 420.

In (e) illustrated in FIG. 7A, a program operation is performed so that the random seed 450 among page metadata on which a randomization operation is not performed is inserted in a randomized position. That is, a write process of the random seed 450 to a spare area is illustrated. The random seed 450 may change a position being written in the spare area with reference to characteristic or an address of the page data. For example, the random seed 450 may be written in a random position of the spare area according to groups (A, B, C) to which the page data belongs or characteristic of the page data. Consequently, an effect similar to the randomization operation may be provided through a variation of a program position of the random seed 450.

FIG. 7B illustrates another method for performing a randomization operation on data being programmed in which the randomization operation is performed before an operation of generating page metadata. Referring to FIG. 7B, in (a) and (b), if the page data 410 is provided, the memory controller 110 performs a randomization operation on the page data 410 before the page metadata is generated and as a result, randomized page data 460 and a random seed 470 are obtained. A process by which page metadata 480 is generated from the randomized page data 460 is illustrated in (c) of FIG. 7B. A process by which the random seed 470 is programmed on a random position of a spare area in which the page metadata 480 is written is illustrated in (d) of FIG. 7B. That is, a write process of the random seed 470 to the spare area is illustrated. The random seed 470 may change a position in which the random seed 470 is written with reference to characteristic or an address of the page data. For example, the random seed 470 may be written in a random position of the spare area according to groups (A, B, C) to which the page data belongs or characteristic of the page data. Consequently, an effect similar to the randomization operation may be provided through a variation of a program position of the random seed 470.

FIGS. 7A and 7B illustrate examples in which page metadata is not randomized, and randomization of the page data may take place before or after page metadata is formed. However, the feature according to example embodiments relating to the random seed being stored in a random position is not limited to the embodiments described above but may change.

FIG. 8 is a table illustrating an example of an allotment of a plurality of pages programmed on each of a plurality of word lines (WL0-WL43). Referring to FIG. 8, page data having page number (or page address) of 20, 21, 28, 29, 36 and 37 is programmed on memory cells corresponding to a word line (WL5). Page data having page number of 20, 21 is allotted to A group, page data having page number of 28, 29 is allotted to B group and page data having page number of 37, 37 is allotted to C group. Random seed with respect to page data and page metadata corresponding to each of A, B, and C groups is recorded in a different position of a spare area.

Figure 9:
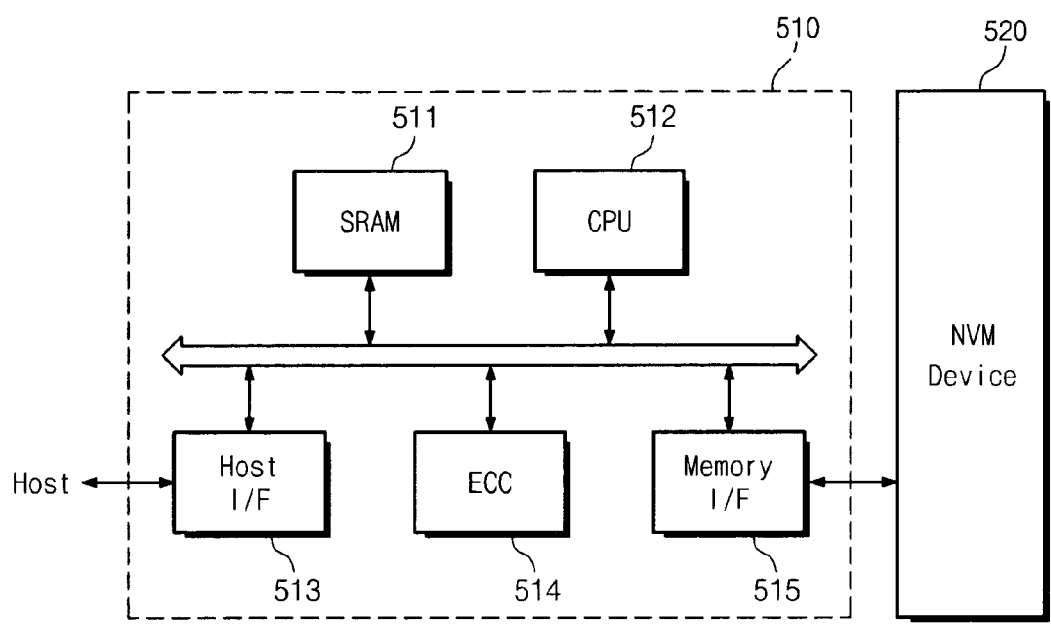
FIG. 9 is a block diagram illustrating a memory system storing or reading data according to a data processing method according to example embodiments.

FIG. 9 is a block diagram illustrating a memory system 500 in accordance with example embodiments. Referring to FIG. 9, the memory system 500 includes a nonvolatile memory device 520 and a memory controller 510.

The nonvolatile memory device 520 may be comprised of the flash memory device illustrated in FIG. 3. The memory controller 510 is configured to control the nonvolatile memory device 520. The nonvolatile memory device 520 is combined with the memory controller 510 to be provided as a memory card or a solid state disk (SSD). SRAM 511 is used as an operation memory of a processing unit 512.

A host interface 513 includes data exchange protocol of a host connected to the memory system 500. An error correction block 514 detects and corrects errors included in data read from the nonvolatile memory device 520. Page metadata is also generated by the error correction block 514. A memory interface 515 interfaces with the nonvolatile memory device 520. A processing unit 512 performs every control operation for data exchange of the memory controller 510. Although not illustrated in the drawing, the memory system 500 may further provide ROM (not illustrated) storing code data for interfacing with the host. The nonvolatile memory device 520 may be provided as multi-chip package comprised of a plurality of flash memory chips.

When a randomization operation is performed, the processing unit 512 performs randomization processing on the page data and the page metadata and generates a random seed using the key value. Also, when a read operation is performed, arrangements of the randomized page data and the page metadata are recovered to before the program is performed using the read random seed. The memory controller 510 may include hardware such as a randomizer and/or derandomizer for performing a randomization operation. Firmware which can fully perform a randomization operation may be included in the memory controller 510.

The memory system 500 can solve the problem which can occur due to non-uniform arrangement of data. Thus, the memory system 500 can lengthen a life of the nonvolatile memory device 520 and may be provided as storage medium of high reliability having a low probability of error occurrence. In particular, the flash memory device according to example embodiments may be included in a memory system such as a solid state disk (SSD). In this case, the memory controller 510 may communicate with an external device (e.g., host) through one of various interface protocols such as USB, MMC, PCI-E, SATA, PATA, SCSI, ESDI and IDE.

Figure 10:
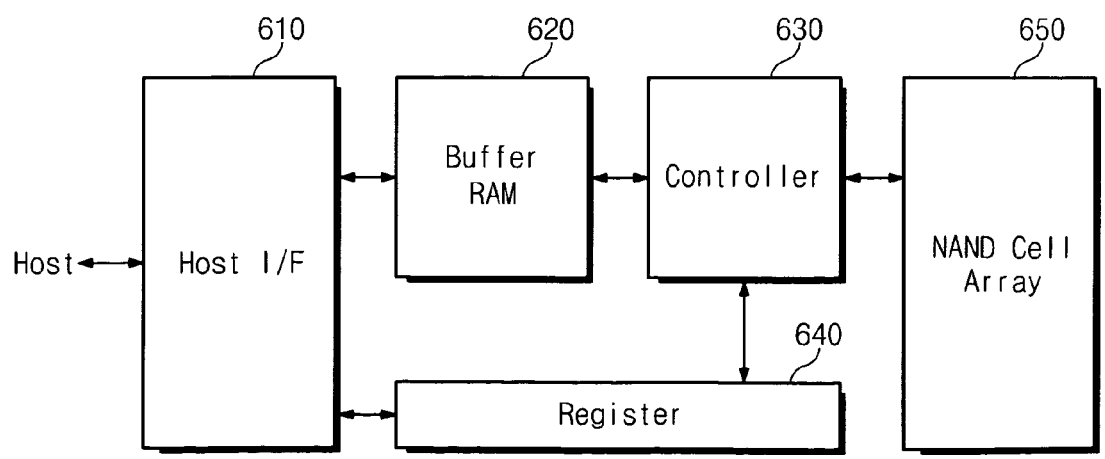
FIG. 10 is a block diagram illustrating one-NAND flash memory device storing or reading data according to a data processing method according to example embodiments.

FIG. 10 is a block diagram illustrating a fusion memory device or a fusion memory system 600 performing program operations according to various embodiments described above. For example, a technical feature according to example embodiments as discussed above with reference to FIGS. 1-8 may be applied to the one NAND flash memory device 600 as a fusion memory device.

The one NAND flash memory device 600 includes a host interface 610 for exchanging various information with devices using different protocols, a buffer RAM 620 fitted with a code for driving a memory device or temporarily storing data, a controller 630 controlling a read program and every state in response to a control signal and a command provided from an external device, a register 640 storing data such as an address, a command and configuration defining an internal system operation environment of a memory device and a flash cell array 650 comprised of a nonvolatile memory cell and a page buffer. The one NAND flash memory device 600 performs a randomization operation on page data and page metadata in response to a write request from the host. A phenomenon where the selected page memory cells are prone to being repeatedly programmed with specific data can be avoided by randomly setting a storage position of a random seed which is a key value of a randomization operation.

Figure 11:
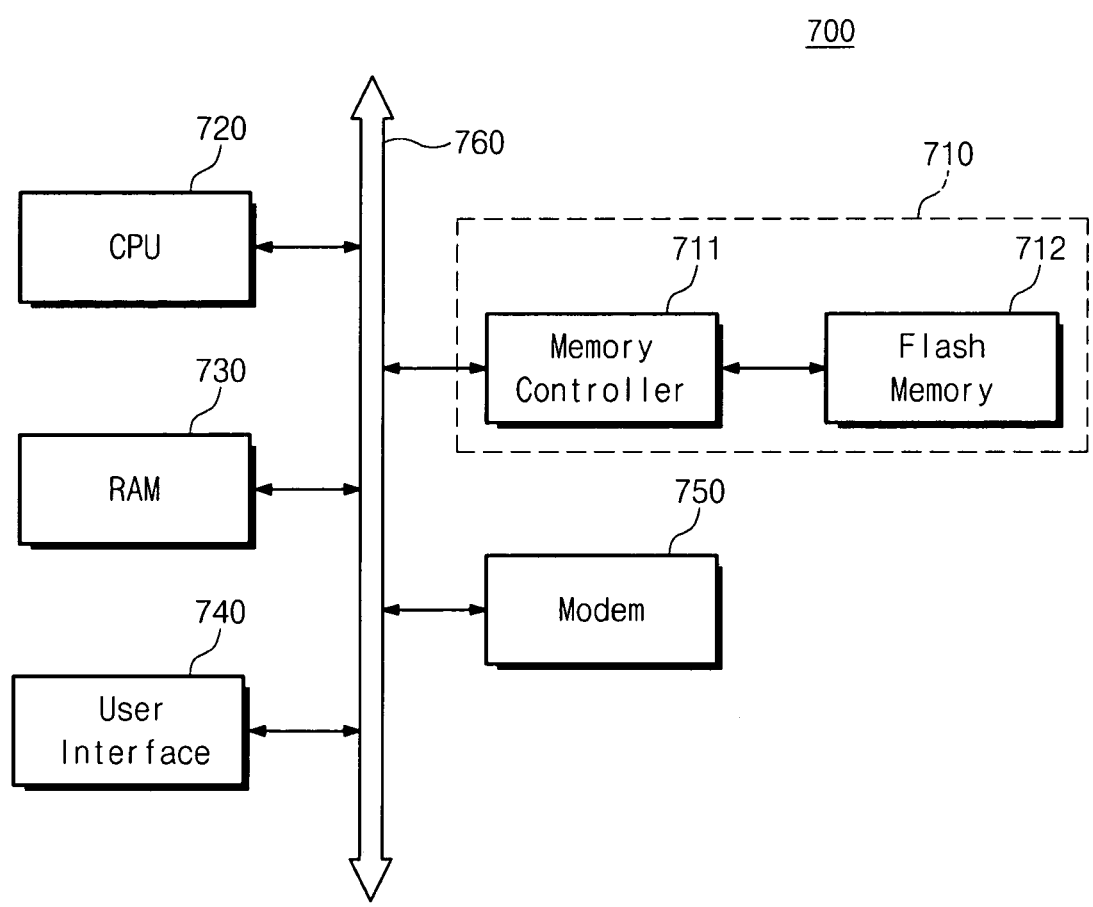
FIG. 11 is a block diagram illustrating a computing system including a memory card which operates according to a data processing method according to example embodiments.

FIG. 11 illustrates a computing system 700 including a flash memory device 712 in accordance with example embodiments. The computing system 700 includes a microprocessor 720, a RAM 730, a user interface 740, a modem 750 such as a baseband chipset and a memory system 710 that are electrically connected to a system bus 760. The memory system 710 is constituted to be identical with the memory system illustrated in FIG. 9 or FIG. 10. In a case that the computing system 700 is a mobile device, a battery (not illustrated) for providing an operation voltage of the computing system may be further provided. Although not illustrated in the drawing, an application chipset, a camera image processor (CIS), and a mobile DRAM may be further provided to the computing system 700. For example, the memory system 700 may be comprised of solid state disk (SSD) using a nonvolatile memory device to store data. The memory system 700 may be provided by a fusion flash memory (for example, one NAND flash memory).

The flash memory device and/or the memory controller in accordance with example embodiments may be mounted using various types of packages. For example, the flash memory device and/or the memory controller may be mounted using packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP).

According to the semiconductor memory device and data processing method thereof, all the programmed data can be randomized, thereby making it possible to improve reliability of a memory.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of processing data of a nonvolatile memory comprising:
   performing a randomization operation on a data unit including page data to be programmed into the nonvolatile memory and page metadata corresponding to the page data;
   generating a random seed; and
   programming the randomized data unit, and the random seed into the nonvolatile memory, the randomized data unit including the randomized page data and the randomized page metadata,
   wherein the random seed is programmed within the randomized page metadata, and a position within the page metadata at which the random seed is programmed is based on a characteristic of the page data.

2. The method of claim 1, wherein the programming the randomized data unit includes storing the randomized page metadata and the random seed in a spare area of the nonvolatile memory.

3. The method of claim 2, wherein the program position of the random seed in the spare area is determined based on a page address corresponding to the page data.

4. The method of claim 1, wherein the nonvolatile memory includes multi-level cells and the randomized page data is programmed on a plurality of memory cells connected to the same word line of the nonvolatile memory.

5. The method of claim 4, wherein the programming the randomized data unit includes programming the randomized page metadata and the random seed in a spare area of the plurality of memory cells, and the position within the spare area in which the random seed is programmed being based on a page address of the page data.

6. The method of claim 1, further comprising:
   detecting a position of the random seed with reference to a page address;
   reading the random seed from the nonvolatile memory with reference to the detected position of the random seed;
   reading the randomized page data and the randomized page metadata from the nonvolatile memory; and
   restoring non-randomized arrangements of the randomized page data and the randomized page metadata with reference to the read random seed.

7. The method of claim 1, further comprising generating the page metadata based on the page data to be programmed.

8. The method of claim 1, wherein the position in which the random seed is programmed is based on a size of an offset, the size of the offset being selected based on the characteristic of the page data.

9. A memory system comprising:
   a nonvolatile memory device; and
   a memory controller, the memory controller being configured to generate a random seed by performing a randomization operation on a data unit include page data to be programmed into the nonvolatile memory device and page metadata corresponding to the page data, the memory controller being configured to control the nonvolatile memory device to program the randomized data unit, and the random seed into the nonvolatile memory unit, the randomized data unit including the randomized page data and the randomized page metadata,
   wherein the memory controller is further configured to program the random seed within the page metadata, and to vary a position at which the random seed is programmed within the page metadata based on an address of the page data.

10. The memory system of claim 9, wherein the address of the page data is one of a plurality of page addresses corresponding to memory cells connected to the same word line of the nonvolatile memory device.

* * * * *